United States Patent [19]
Sato et al.

[11] 4,411,929
[45] Oct. 25, 1983

[54] METHOD FOR MANUFACTURING SEMICONDUCTOR DEVICE

[75] Inventors: Shinichi Sato; Hiroshi Harada; Takaaki Fukumoto; Hirozo Takano; Hideo Kotani; Shinpei Kayano, all of Hyogo, Japan

[73] Assignee: Mitsubishi Denki Kabushiki Kaisha LSI Development Laboratory, Itami, Japan

[21] Appl. No.: 293,793

[22] Filed: Aug. 18, 1981

[30] Foreign Application Priority Data

Aug. 19, 1980 [JP] Japan .................. 55-114492

[51] Int. Cl.$^3$ ........................... H01L 21/28
[52] U.S. Cl. ........................... 427/38; 427/94; 427/93; 427/88; 204/192 N
[58] Field of Search ............ 427/94, 38, 93, 88; 148/1.5; 357/91; 204/192 N

[56] References Cited
U.S. PATENT DOCUMENTS 4,016,007  4/1977  Wada et al. ................. 427/94 X
4,277,320  7/1981  Beguwala et al. ........... 427/94 X

FOREIGN PATENT DOCUMENTS 15694  9/1980  European Pat. Off. ........ 427/94

Primary Examiner—John D. Smith
Assistant Examiner—Bernard F. Plantz
Attorney, Agent, or Firm—Sughrue, Mion, Zinn, Macpeak and Seas

[57] ABSTRACT

A method for manufacturing a semiconductor integrated circuit device having contact apertures with finely-controlled dimensions of 1 μm or less. An ion bombardment layer is formed by bombarding predetermined portions of the substrate of the semiconductor device with nitrogen ions using a direct ion beam imaging technique. The ion bombardment layer is converted into an oxidation-resistant layer by annealing, and an insulating oxide layer is formed on the surface of the substrate in regions other than those on which the oxidation-resistant layer is formed by oxidation. Thereafter, contact recesses are formed upon removing the oxidation-resistant layer.

6 Claims, 6 Drawing Figures

METHOD FOR MANUFACTURING SEMICONDUCTOR DEVICE

BACKGROUND OF THE INVENTION

The present invention relates to a method for manufacturing a semiconductor integrated circuit device. The present invention, more particularly, relates to a manufacturing method in which a fine contact aperture is formed on the semiconductor device.

FIGS. 1A and 1B are sectional view showing various manufacturing steps in the conventional method used for forming contact recesses in a semiconductor device, for example, a "MOS" type semiconductor device. In FIGS. 1A and 1B, reference numeral 1 indicates a substrate made of silicon, 2 a source-drain diffusion layer, 3 a separating silicon dioxide layer, 4 a silicon gate electrode, and 5 an insulating silicon dioxide layer. In the case that a conductive electrode is to be formed connecting with the source-drain diffusion layer or the gate electrode formed on the substrate, the following difficult manufacturing processes must be performed.

First a resist layer is formed as a mask, using well-known photolithographic techniques, on the substrate in areas other than those where the conductive electrode is to be deposited. Successively, the insulating silicon dioxide layer 5 is partly etched away after which the electrode metal is deposited through the etched recess. The resist layer 6 is then removed after which the device has the final construction as shown in FIG. 1B.

In the case of above-described method, it is very difficult to accurately form apertures with a width of 1 $\mu$m or less. Although it is possible to form the resist pattern with aperture widths of 1 $\mu$m or less using electron beam exposure techniques, in the following etching process it is very difficult to form an aperture which an accuracy of 1 $\mu$m on the desired layer with the conventional etching technique. The method of etching used in this process may be an ion etching method or the like or micro-machining may be used. However, these conventional etching techniques are difficult to put to practical use because of the difficulty in etching selectively the resist layer 6 and the substrate 1.

SUMMARY OF THE INVENTION

The present invention is provided in order to overcome the disadvantages in the conventional techniques. Specifically, in accordance with the invention, a mask layer with finely controlled dimensions is formed selectively using direct ion beam imaging. Following this, a fine contact aperture having a width of 1 $\mu$m or less is produced by selective oxidation.

More specifically, the invention provides a method for manufacturing a semiconductor device comprising the steps of forming an ion bombardment layer on at least one predetermined portion on a surface of a semiconductor substrate by direct ion beam imaging, and subjecting the ion bombardment layer to annealing to convert the ion bombardment layer to an oxidation-resistant layer.

Yet more specifically, the invention provides a method for manufacturing a semiconductor device including the steps of forming an ion bombardment layer on at least one predetermined portion on a surface of a semiconductor substrate selectively by direct ion beam imaging, converting the ion bombardment layer into an oxidation-resistant layer by annealing, forming an insulating oxide layer on the surface of the semiconductor substrate in regions other than those on which the oxidation-resistant layer is formed by oxidation, and creating a contact recess by removing the oxidation-resistant layer.

DESCRIPTION OF THE PREFERRED EMBODIMENTS

The present invention will be described with reference to the accompanying drawings.

Figure 1A:
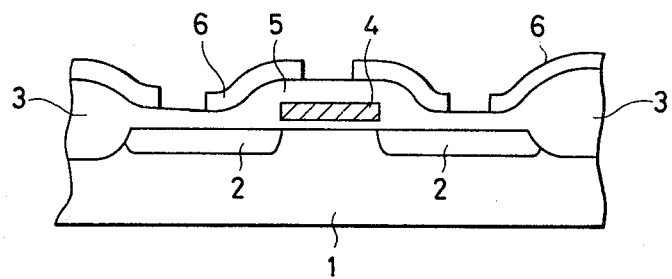
FIGS. 1A and 1B are cross-sectional views illustrating manufacturing steps of a conventional manufacturing method.
Figure 1B:
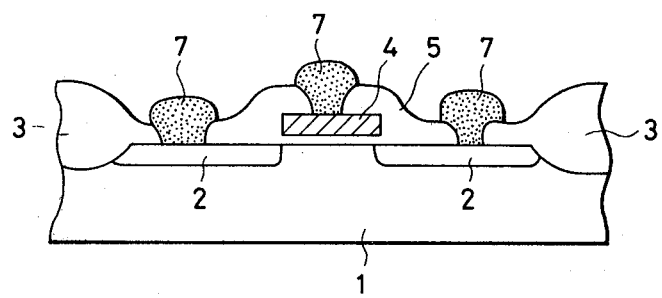
Figure 2A:
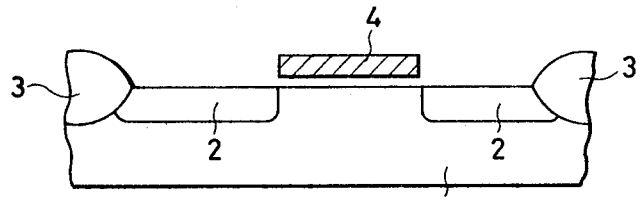
FIGS. 2A–2D are cross-sectional views illustrating manufacturing steps of a manufacturing method of the present invention.
Figure 2B:
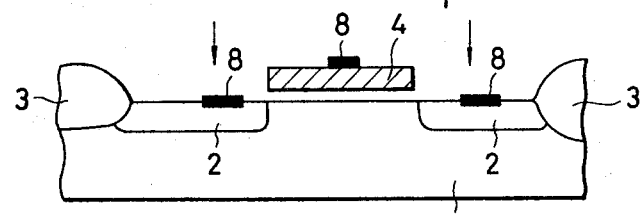
Figure 2C:
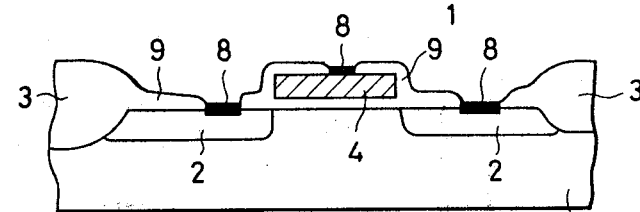
Figure 2D:
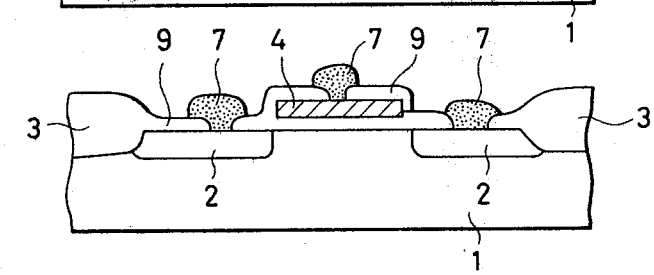

FIGS. 2A–2D are cross-sectional views illustrating manufacturing steps in accordance with a preferred method of the present invention. The source-drain diffusion layer 2 lying on the substrate 1 and the separated oxide layer 3 and the silicon gate electrode 4 are formed in the same manner as with the conventional manufacturing method. Silicon nitride layers 8 are then formed on a predetermined portions of the surface of the semiconductor substrate 1 and the silicon gate electrode 4 by nitrogen ion beam bombardment using an ion beam imaging technique. In this case, fine pattern dimensions of 1 $\mu$m or less can be formed. Following this, the device thus constructed is heated in a nitrogen atmosphere to a temperature in a range of 1000°–1050° C. thereby to change the ion bombarded layers into silicon nitride layers by annealing (FIG. 2B). Following this, a silicon oxide layer 9 is grown to a thickness 1000–2000 Å on the silicon semiconductor substrate 1 and the surface of silicon gate electrode 4 other than on the surface of the silicon nitride layers 8 (FIG. 2C). Next, the silicon nitride layers 8 are removed by phosphoric acid etching or the like. Thereafter, the electrode can be connected with source-drain diffusion layer 2 or the silicon gate electrode 4 formed on the semiconductor substrate 1 FIG. 2D).

With such an ion beam direct imaging method, a mask with finely controlled dimensions is provided, and thereafter using selective oxidation through the mask thus formed, a very small contact aperture or recess is reliably and easily formed. Also, with this method, the shape of the contact aperture is smoother than that provided with the conventional method and the possibility of fracturing of the metal conductors is accordingly reduced.

In addition, although nitrogen is used as the bombarding ion in the described embodiment, other suitable materials may be used. Also, for devices other than "MOS" type devices and on semiconductor substrates other than silicon, it is possible to form a fine contact recess using the present invention.

What is claimed is:

1. A method of manufacturing a semiconductor device comprising the steps of: forming an ion bombardment layer having a configuration corresponding to a desired contact aperture configuration on at least one predetermined portion on a surface of a semiconductor substrate by direct ion beam imaging; and subjecting said ion bombardment layer to annealing to convert said ion bombardment layer to an oxidation-resistant layer.

2. The method for manufacturing a semiconductor device as claimed in claim 1 wherein said semiconductor substrate comprises a silicon substrate.

3. The method for manufacturing a semiconductor device as claimed in claim 1 or 2 wherein said step of forming an ion bombardment layer comprises bombarding said at least one predetermined portion with nitrogen ions and wherein said oxidation-resistant layer comprises a silicon nitride layer.

4. A method for manufacturing a semiconductor device comprising the steps of: forming an ion bombardment layer having a configuration corresponding to a desired contact aperture configuration on at least one predetermined portion on a surface of a semiconductor substrate selectively by direct ion beam imaging; converting said ion bombardment layer into an oxidation-resistant layer by annealing; forming an insulating oxide layer on said surface in regions other than on said oxidation-resistant layer by oxidation; and forming a contact recess by removing said oxidation-resistant layer.

5. The method for manufacturing a semiconductor device as claimed in claim 4 wherein said insulating oxide layer comprises a silicon oxide layer.

6. The method for manufacturing a semiconductor device as claimed in claim 4 or 5 wherein said step of forming an ion bombardment layer comprises bombarding said at least one predetermined portion with nitrogen ions.

* * * * *